(12) United States Patent
Hu

(10) Patent No.: US 7,586,960 B2
(45) Date of Patent: Sep. 8, 2009

(54) FORCED WAVELENGTH CHIRPING IN SEMICONDUCTOR LASERS

(75) Inventor: Martin Hai Hu, Painted Post, NY (US)

(73) Assignee: Corning Incorporated, Corning, NY (US)

(*) Notice: Subject to any disclaimer, the term of this patent is extended or adjusted under 35 U.S.C. 154(b) by 27 days.

(21) Appl. No.: 11/998,684

(22) Filed: Nov. 30, 2007

(65) Prior Publication Data

US 2008/0175285 A1 Jul. 24, 2008

Related U.S. Application Data

(60) Provisional application No. 60/886,186, filed on Jan. 23, 2007.

(51) Int. Cl.
*H01S 3/10* (2006.01)
(52) U.S. Cl. .................................. 372/28; 372/43.01
(58) Field of Classification Search ............. 372/28, 372/43.01
See application file for complete search history.

(56) References Cited

U.S. PATENT DOCUMENTS

| | | | |
|---|---|---|---|
| 5,220,578 A | 6/1993 | Koch et al. | |
| 5,473,625 A | 12/1995 | Hansen et al. | |
| 6,738,398 B2 | 5/2004 | Hirata et al. | |
| 6,816,525 B2 | 11/2004 | Stintz et al. | |
| 2002/0125406 A1 | 9/2002 | Roddy et al. | 250/205 |
| 2004/0008612 A1 | 1/2004 | Tsujita et al. | |
| 2004/0264525 A1* | 12/2004 | Senga et al. | 372/38.1 |
| 2006/0159139 A1 | 7/2006 | Hu et al. | 372/26 |
| 2006/0215716 A1 | 9/2006 | Luo et al. | 372/29.011 |

FOREIGN PATENT DOCUMENTS

| | | |
|---|---|---|
| EP | 1710876 A | 2/1983 |
| EP | 1703318 A1 | 9/2006 |
| JP | 58025735 | 2/1983 |

OTHER PUBLICATIONS

Kitaoka, Y. et al., Wavelength stabilization of a distributed Bragg reflector laser diode by use of complementary current injection, Optics Letters, Jun. 1, 2003, vol. 28, No. 11.
Yamada, M. et al., Analysis of gain suppression in undoped injection lasers, 1981 American Institute of Physics, pp. 2653-2664, Apr. 1981, vol. 52, No. 4.
Chawla, S., Frequency stabilization of diode lasers, National Physical Laboratory, New Delhi, India.
Ahmed, M. et al., Influence of the Spectral Gain Suppression on the Intensities of Longitudinal Modes in 1.55 μm InGaAsP Lasers, pp. 205-223, Egypt. J. Sol., vol. 26. No. 2, 2003.

(Continued)

*Primary Examiner*—Dung T Nguyen
(74) *Attorney, Agent, or Firm*—Kwadjo Aduse-Poku

(57) ABSTRACT

Methods of controlling semiconductor lasers are provided where, the time-averaged optical spectrum of the semiconductor laser is broadened by modulating the drive current at a relatively high frequency. Generally, the frequency of the drive current modulation is high enough to induce wavelength chirping within the data periods encoded in the gain current signal. Laser controllers and projections systems operating according to the disclosed methodology are also provided.

20 Claims, 4 Drawing Sheets

OTHER PUBLICATIONS

Nakamura, M. et al., Longitudinal-mode behaviors of mode-stabilized AlxGa1-xAs Injection lasers, American Inst. of Physics, Sept. 1978, pp. 4644-4648, vol. 49, No. 9.

Ogasawara, N. et al., Longitudinal Mode Competition and Asymmetric Gain Saturation in Semiconductor Injection Lasers, Japanese Journal of Applied Physics, Apr. 1988, vol. 27, No. 4.

Hori, H. et al., Mode-transition characteristics and tunability of an AlGaAs laser, Am Institute of Physics, Oct. 1986, pp. 2231-2237, vol. 60, No. 7.

Chu, D. et al., Optical networks promote tunable laser development, LaserFocusWorld, Aug. 2001.

Major, J. et al., Singlemode InGaAs/GaAs distributed Bragg reflector laser diodes operating at 1083 nm, Electronics Letters, Nov. 25, 1993, pp. 2131-2122, vol. 29, No. 224.

Eliseev, P. et al., Tunable Grating-Coupled Laser Oscillation and Spectral Hole Burning in an InAs Quantum-Dot Laser Diode, IEEE Journal, 2000, pp. 479-485, vol. 36., No. 4.

Linke, R., Modulation Induced Transient Chirping in Single Frequency Lasers, IEEE Journal of Quantum Electronics, Jun. 1985, vol. Qe-21, No. 6.

Wang, S. et al., Dynamic and CW linewidth measurements of 1.55-μm InGaAs-InGaAsP multiquantum well distributed feedback lasers, IEEE Photonics Technology Letters, 1990, pp. 775-777, vol. 2, No. 11.

Obermann, K. et al., Turn-on jitter in zero-biased single-mode semiconductor lasers, IEEE Photonics Technology Letters, 1996, pp. 31-33, vol. 8, No. 1.

Koch, T. et al., Nature of wavelength chirping in directly modulated semiconductor lasers, IEEE Electronics Letters, 1984, pp. 1038-1039, vol. 20, No. 25-26.

* cited by examiner

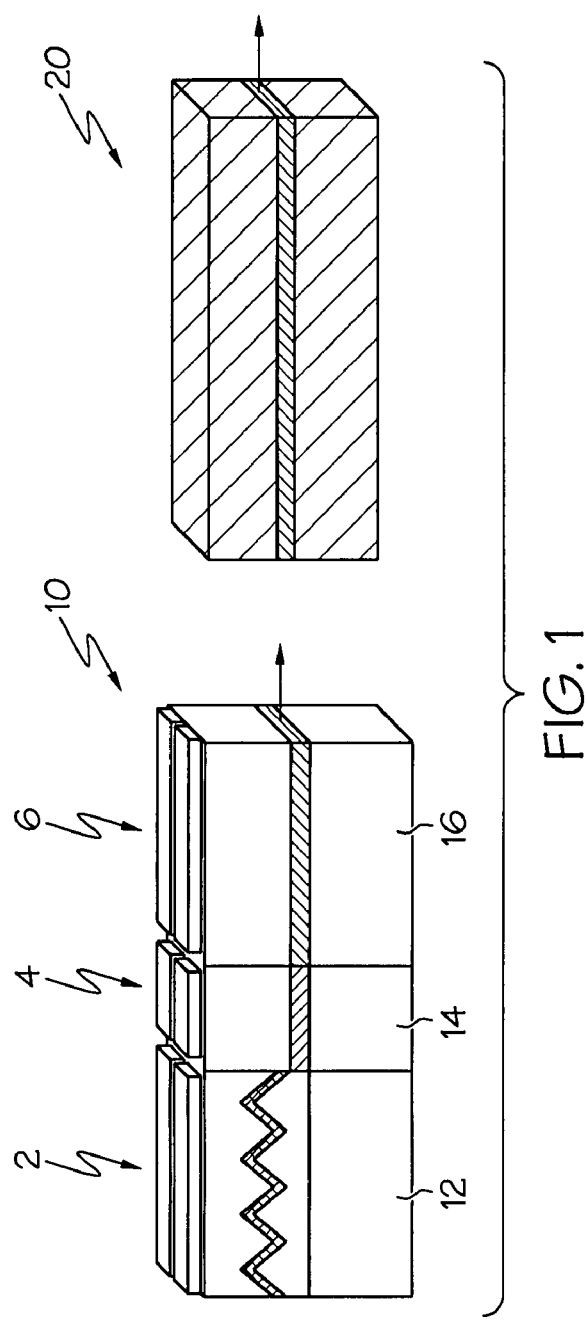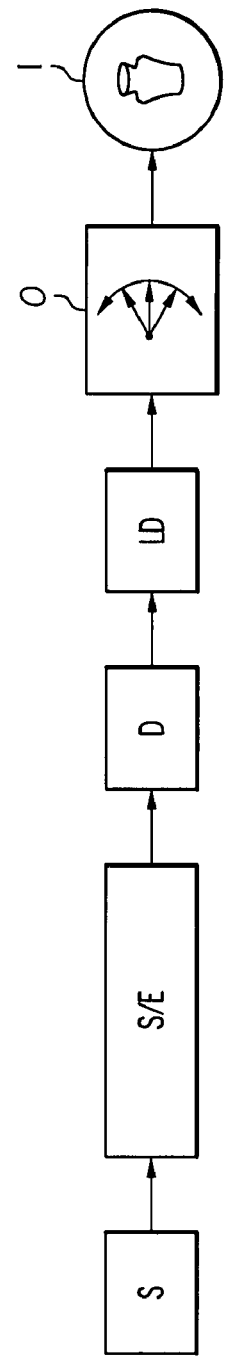

FORCED WAVELENGTH CHIRPING IN SEMICONDUCTOR LASERS

CROSS REFERENCE TO RELATED APPLICATIONS

This application claims the benefit of U.S. Provisional Application Ser. No. 60/886,186, filed Jan. 23, 2007.

SUMMARY OF THE INVENTION

The present invention relates generally to semiconductor lasers, laser controllers, laser projection systems, and other optical systems incorporating semiconductor lasers. More particularly, by way of illustration and not limitation, embodiments of the present invention relate generally to schemes for disrupting the temperature evolution signature of a semiconductor laser and schemes for minimizing systematic intensity variations in the output of a second harmonic generation (SHG) crystal or other wavelength conversion device optically coupled to the semiconductor laser.

Semiconductor lasers according to the present invention may be configured in a variety of ways. For example and by way of illustration, not limitation, short wavelength sources can be configured for high-speed modulation by combining a single-wavelength semiconductor laser, such as a distributed feedback (DFB) laser, a distributed Bragg reflector (DBR) laser, or a Fabry-Perot laser with a light wavelength conversion device, such as a second harmonic generation (SHG) crystal. The SHG crystal can be configured to generate higher harmonic waves of the fundamental laser signal by tuning, for example, a 1060 nm DBR or DFB laser to the spectral center of a SHG crystal, which converts the wavelength to 530 nm. However, the wavelength conversion efficiency of an SHG crystal, such as MgO-doped periodically poled lithium niobate (PPLN), is strongly dependent on the wavelength matching between the laser diode and the SHG device. As will be appreciated by those familiar with laser design DFB lasers are resonant-cavity lasers using grids or similar structures etched into the semiconductor material as a reflective medium. DBR lasers are lasers in which the etched grating is physically separated from the electronic pumping area of the semiconductor laser. SHG crystals use second harmonic generation properties of non-linear crystals to frequency double laser radiation.

The bandwidth of a PPLN SHG device is often very small—for a typical PPLN SHG wavelength conversion device, the full width half maximum (FWHM) wavelength conversion bandwidth is often only in the 0.16 to 0.2 nm range and mostly depends on the length of the crystal. Mode hopping and uncontrolled large wavelength variations within the laser cavity can cause the output wavelength of a semiconductor laser to move outside of this allowable bandwidth during operation. Once the semiconductor laser wavelength deviates outside the wavelength conversion bandwidth of the PPLN SHG device, the output power of the conversion device at the target wavelength drops drastically. For example, in laser projection systems where a DBR semiconductor laser and an SHG crystal are used as the light source, mode hops are particularly problematic because they can generate instantaneous changes in power that will be readily visible as defects at specific locations in the image. These visible defects typically manifest themselves as organized, patterned image defects across the image because the generated image is simply the signature of the temperature evolution of the different sections of the laser.

Given the challenges associated with wavelength matching and stabilization in developing semiconductor laser sources, the present inventors have recognized beneficial schemes for minimizing systematic intensity variations in the output of a second harmonic generation (SHG) crystal or other wavelength conversion device optically coupled to the semiconductor laser by forcing wavelength chirping in the semiconductor laser. The forced chirping effectively broadens the optical spectrum of the laser and reduces the variation of intensity of the second harmonic light under the presence of the thermal patterning effect.

According to some embodiments of the present invention, the gain current of a DFB or DBR laser is modulated at relatively high speed, i.e., above about 0.1 GHZ. This high-speed modulation causes carrier-density oscillation in the semiconductor laser, which in turn leads to oscillation of the lasing wavelength. The carrier density and lasing wavelength oscillation can be increased even more by letting the low-level of the modulated gain current drop below the laser threshold current. The present inventors have recognized that although the concepts of the present invention are described primarily in the context of DBR and DFB lasers, it is contemplated that the control schemes discussed herein will also have utility in a variety of types of semiconductor lasers, including but not limited to Fabry-Perot lasers, and many types of external cavity lasers.

According to one embodiment of the present invention, a method of controlling a semiconductor laser is provided. According to the method, at least one of the sections of the semiconductor laser is modulated to provide data. For example, and not by way of limitation, in the case of laser projection systems where a DBR semiconductor laser and an SHG crystal are used as the light source, the gain current $I_{GAIN}$ can be modulated to generate grey levels in the projected image. This modulation generates some fluctuation of the laser wavelength, which results in an unintentional variation of the intensity of the projected light. In the context of a relatively stationary image, the wavelength fluctuation will repeat itself frame-by-frame, resulting in a systematic and organized image bias that can easily be detected by the human eye. To address this issue, the time-averaged optical spectrum of the semiconductor laser is broadened by an additional modulation of the drive current at a relatively high frequency. Generally, the frequency of this additional drive current modulation is high enough to induce wavelength chirping within the data periods encoded in the gain current signal.

More specifically, according to one embodiment of the present invention, a method of controlling a semiconductor laser configured for optical emission of encoded data is provided. According to the method, the encoded data is presented as a series of encoded data periods. The lasing intensity within each data period is a function of the drive current $I_{GAIN}$ injected into the gain section of the semiconductor laser. The time-averaged optical spectrum of the semiconductor laser is broadened by modulating the drive current at a frequency that is sufficient for the selection of a plurality of different emission modes in the semiconductor laser, within respective ones of the encoded data periods.

Laser controllers programmed to operate semiconductor lasers according to the concepts of the present invention are also contemplated; as are laser projection systems driven by such controllers. Although the concepts of the present invention are described primarily in the context of image forming, it is contemplated that various concepts of the present invention may also be applicable to any laser application where repeatable low frequency fluctuation of the laser wavelength is an issue.

BRIEF DESCRIPTION OF THE DRAWINGS

The following detailed description of specific embodiments of the present invention can be best understood when read in conjunction with the following drawings, where like structure is indicated with like reference numerals and in which:

FIG. 1 is a schematic illustration of a DBR or similar type semiconductor laser optically coupled to a light wavelength conversion device;

FIG. 2 is a schematic illustration of a laser projection system according to one embodiment of the present invention;

DETAILED DESCRIPTION

Figure 3:
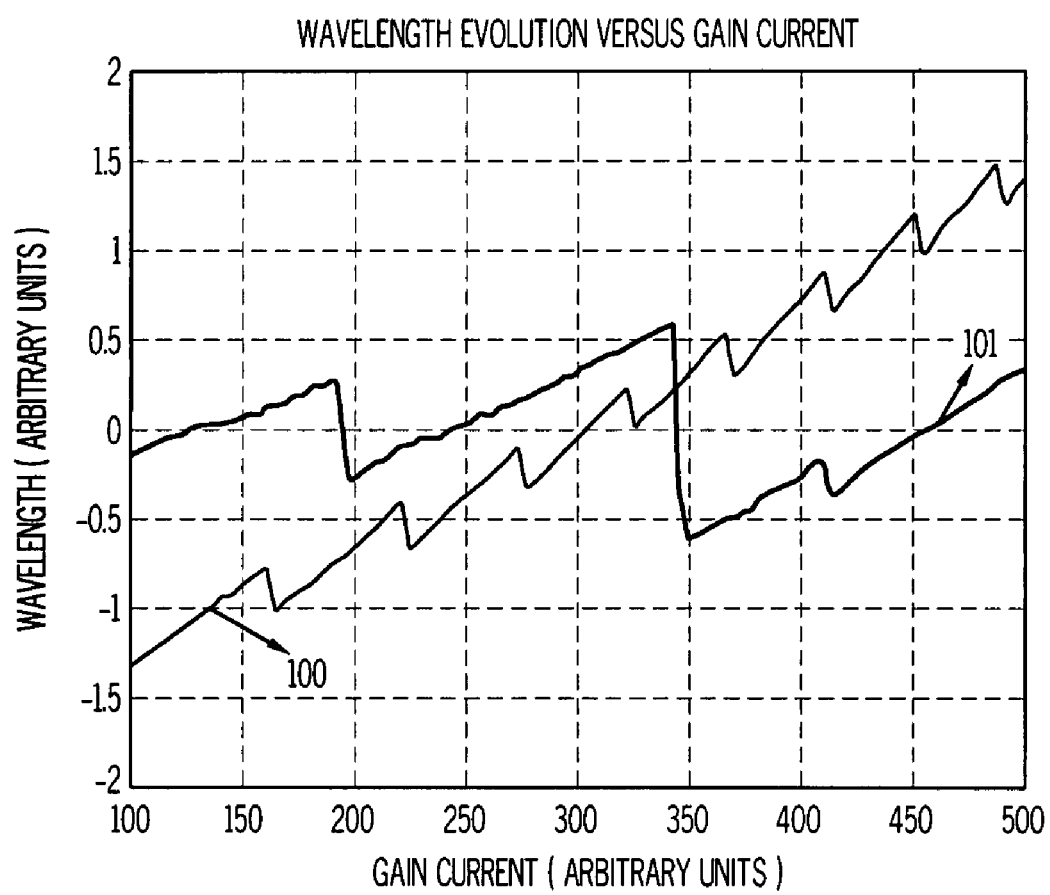
FIG. 3 illustrates the evolution of emission wavelength as a function of gain current in a DBR laser.

Although the specific structure of the various types of semiconductor lasers in which the concepts of particular embodiments of the present invention can be incorporated is taught in readily available technical literature relating to the design and fabrication of semiconductor lasers, the concepts of particular embodiments of the present invention may be conveniently illustrated with general reference to a three-section DBR-type semiconductor laser 10 illustrated schematically in FIG. 1. In FIG. 1, the DBR laser 10 is optically coupled to a light wavelength conversion device 20. The light beam emitted by the semiconductor laser 10 can be either directly coupled into the waveguide of the wavelength conversion device 20 or can be coupled through collimating and focusing optics or some other type of suitable optical element or optical system. The wavelength conversion device 20 converts the incident light into higher harmonic waves and outputs the converted signal. This type of configuration is particularly useful in generating shorter wavelength laser beams from longer wavelength semiconductor lasers and can be used, for example, as a visible laser source for laser projection systems.

The DBR laser 10 illustrated schematically in FIG. 1 comprises a wavelength selective section 12, a phase matching section 14, and a gain section 16. The wavelength selective section 12, which can also be referred to as the DBR section of the laser 10, typically comprises a first order or second order Bragg grating positioned outside the active region of the laser cavity. This section provides wavelength selection, as the grating acts as a mirror whose reflection coefficient depends on the wavelength. The gain section 16 of the DBR laser 10 provides the major optical gain of the laser and the phase matching section 14 creates an adjustable optical phase shift between the gain material of the gain section 16 and the reflective material of the wavelength selective section 12. The wavelength selective section 12 may be provided in a number of suitable alternative configurations that may or may not employ a Bragg grating.

Respective control electrodes 2, 4, 6 are incorporated in the wavelength selective section 12, the phase matching section 14, the gain section 16, or combinations thereof, and are merely illustrated schematically in FIG. 1. It is contemplated that the electrodes 2, 4, 6 may take a variety of forms. For example, the control electrodes 2, 4, 6 are illustrated in FIG. 1 as respective electrode pairs but it is contemplated that single electrode elements 2, 4, 6 in one or more of the sections 12, 14, 16 will also be suitable for practicing particular embodiments of the present invention. The control electrodes 2, 4, 6 can be used to inject electrical current into the corresponding sections 12, 14, 16 of the laser 10. For example, the injected current can be used to alter the operating properties of the laser by controlling the temperature of one or more of the laser sections, injecting electrical current into a conductively doped semiconductor region defined in the laser substrate, controlling the index of refraction of the wavelength selective and phase matching sections 12, 14 of the laser 10, controlling optical gain in the gain section 16 of the laser, etc.

The wavelength conversion efficiency of the wavelength conversion device 20 illustrated in FIG. 1 is dependent on the wavelength matching between the semiconductor laser 10 and the wavelength conversion device 20. In cases where the wavelength conversion device 20 comprises an SHG crystal, the output power of the higher harmonic light wave generated in the SHG crystal 20 drops drastically when the output wavelength of the laser 10 deviates from the wavelength conversion bandwidth of the SHG crystal. For example, when a semiconductor laser is modulated to produce data, the thermal load varies constantly. The resulting change in laser temperature and lasing wavelength can be referred to as the wavelength thermal patterning effect. This thermal patterning effect generates a variation of the efficiency of the SHG crystal 20. In the case of a 12 mm-long PPLN SHG device, a temperature change in the semiconductor laser 10 of about 2° C. will typically be enough to take the output wavelength of the laser 10 outside of the 0.16 nm full width half maximum (FWHM) wavelength conversion bandwidth of the SHG crystal 20.

The present inventors have recognized challenges in stabilizing the emission wavelength of a semiconductor laser because they are commonly subject to wavelength drift and associated cavity mode hopping. For example, and not by way of limitation, FIG. 3 illustrates the evolution of emission wavelength as a function of gain current in a DBR laser. When the gain current increases, the temperature of the gain section also increases. As a consequence, the cavity modes move towards higher wavelengths. The wavelength of the cavity modes move faster than the wavelength of the DBR section. So, the laser reaches a point where a cavity mode of lower wavelength is closer to the maximum of the DBR reflectivity curve. At that point, the mode of lower wavelength has lower loss than the mode that is established and, according to basic principles of laser physics, the laser then automatically jumps to the mode that has lower loss. This behavior is illustrated on the curve 100 of FIG. 3. As is illustrated in FIG. 3, the wavelength slowly increases and includes sudden mode hops whose amplitude is equal to one free spectral range of the laser cavity.

Referring further to FIG. 3, curve 101 illustrates significantly different emission behavior in a DBR laser. Specifically, a laser having the same general manufacturing parameters as the laser illustrated with reference to curve 100, may exhibit significantly different behavior in the sense that, instead of having mode hops with an amplitude of one laser free spectral range, the laser will exhibit mode hops having up to 6 or more free spectral range amplitudes. For many applications, this large sudden wavelength variation would not be acceptable. For example, in the case of a laser projection system, these large hops would cause sudden intensity jumps in the image from a nominal grey-scale value to a value close to zero. The present inventors have investigated this phenomena, as well as wavelength instability and hysteresis in lasers, and note that these laser emission defects can be attributed to one or more of a variety of factors, including spatial hole burning, spectral hole burning, asymmetric gain saturation, gain profile broadening, and self induced Bragg gratings. It is contemplated that these factors may lock lasing on the particular cavity mode that has been established in the laser cavity or encourage larger mode hops. Indeed, it appears that once a mode is established, the photons that are inside the cavity at a specific wavelength disturb the laser itself by depleting and modifying the carrier density at a specific energy level or by creating a self induced Bragg grating in the cavity.

Regardless of the cause of multi-mode drift in semiconductor lasers, when this phenomenon occurs, the lasing wavelength usually shows abnormal wavelength jumps which are equal to a multiple of the cavity mode spacing. Before a large mode hop occurs, the laser usually shows large continuous wavelength shift. The larger wavelength drift and the abnormal wavelength jump can cause unacceptable noise in a laser signal. For example, referring to FIG. 2, a laser projection system is illustrated comprising an image source (S) generating a single or multi-color image data stream, image projection software and associated electronics (S/E) for generating a laser drive signal for each primary image color, a laser driver (D) generating respective laser drive currents for individual lasers (LD) configured to generate each primary image color, and scanning and projection optics (O) that operate to generate a single or multi-color projected image (I) comprising an array of image pixels. If this above-described phenomenon happens systematically in a semiconductor/SHG laser projection system of the type illustrated in FIG. 2, the noise in the projected image will be readily visible to the human eye. Indeed, the present inventors have recognized that this is the case even for semiconductor lasers that only exhibit single mode hops and corresponding sudden wavelength changes merely equal to one free spectral range of the laser cavity.

The present inventors have also recognized that semiconductor lasers commonly exhibit a temperature evolution signature that can create unfavorable wavelength shifts and sudden changes in the output of the semiconductor laser and the output of the wavelength conversion device coupled to the laser. This unfavorable patterning can create significant problems in the context of the laser projection systems described above.

Although the present invention is not limited to any particular manifestation of the wavelength variations and sudden mode hops described herein, in the context of a laser projection system, these wavelength fluctuations can create smooth intensity variations and the mode hops can create relatively abrupt intensity shifts in the image created by scanning the laser. The particular pattern created in the image by these defects can be a function of a number of factors including, but not limited to, laser temperature, laser free spectral range, the PPLN crystal spectral band pass, the spectral alignment of the laser DBR with respect to the PPLN crystal, etc. Regardless of the nature of the defect pattern, the pattern itself can present a problem in the image because it presents a readily recognizable, systematic structure in the image. Also, for quasi-static images, these defects typically repeat themselves from frame to frame, making it very easy to recognize the defects in the image.

The present inventors have recognized beneficial schemes for minimizing these systematic intensity variations in the output of a second harmonic generation (SHG) crystal or other wavelength conversion device by forcing wavelength chirping in the semiconductor laser to which the conversion device is coupled. The forced chirping effectively broadens the optical spectrum of the laser and reduces the variation of intensity of the second harmonic light under the presence of the thermal patterning effect.

Figure 4:
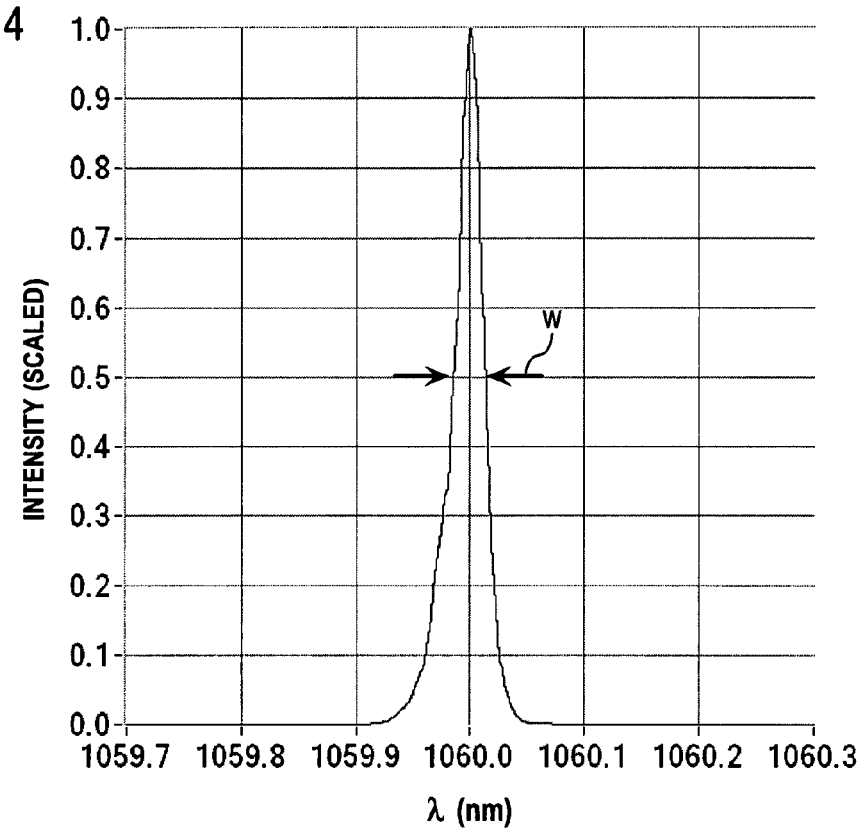
FIG. 4 illustrates a typical single cavity mode optical spectrum for a semiconductor laser.

More specifically, FIG. 4 is a plot of the optical spectrum of a relatively narrow bandwidth semiconductor laser lasing at a single cavity mode. As is illustrated in FIG. 4, the effective spectral bandwidth w of the laser, i.e., the spread of the optical spectrum in the wavelength domain, is about 0.02 nm. When the gain drive current of this laser is changed to produce a desired power output, the peak wavelength, i.e., the wavelength of maximum intensity in FIG. 4, experiences a gradual shift and sudden mode hops due to the aforementioned thermal patterning effect. This gradual shift and the sudden mode hops of the peak wavelength translate to gradual variation and sudden changes of the intensity output of the SHG coupled to the laser.

Figure 5:
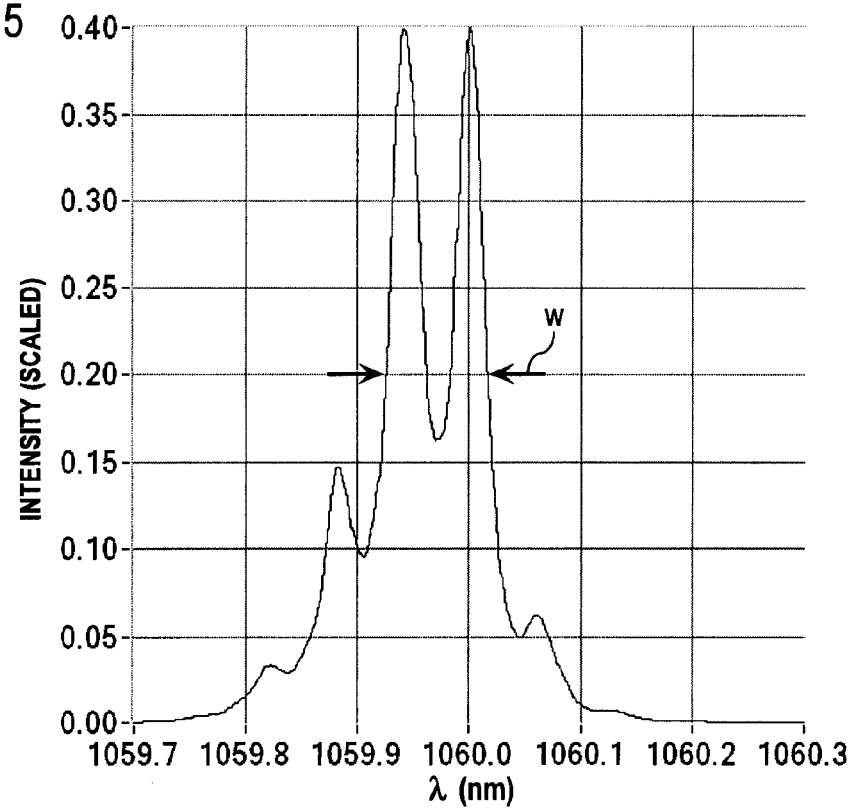
FIG. 5 illustrates a typical time-averaged optical spectrum of a wavelength-chirped laser according to some embodiments of the present invention.

FIG. 5 plots the time-averaged optical spectrum of the same laser, where the drive current $I_{GAIN}$ injected into the gain section of the semiconductor laser is rapidly modulated with a square wave at about 0.5 GHz. The gain drive current low level is close to zero for 1 ns and the high level is much high than threshold current for 1 ns. As is illustrated in FIG. 5, the time-averaged optical spectrum is broadened about threefold because, during modulation, the drive current $I_{GAIN}$ drops to a value that is low enough to change the carrier density in the gain region, creating carrier density oscillation as the drive current $I_{GAIN}$ modulates. As a result, a plurality of different emission modes are selected in the semiconductor laser as the drive current is modulated. For example, there are five cavity modes available in the time-averaged optical spectrum illustrated in FIG. 5, each of which may be selected for lasing during the 1-ns time when the gain drive current is higher than threshold current. The lasing of these plurality of different cavity modes effectively broadens the optical spectrum averaged during a pixel duration $t_P$. In other words, the wavelength chirping forces the laser to oscillate among many cavity modes during a pixel duration $t_P$, overwhelming any slower effect, such as the mode hops induced by the thermal patterning effect.

In cases where a DBR laser is coupled to an SHG crystal, for example, users will see less reduction of the second-harmonic intensity of the SHG crystal when a DBR laser is under rapid wavelength chirping. In addition, the wavelength chirping relaxes the tight requirement of precisely matching the DBR reflection peak to the SHG center wavelength because the effective spectral width of the wavelength-chirped laser is much broader than the single-wavelength laser. Similar benefits would also be enjoyed in applications where other types of semiconductor lasers are coupled to wavelength conversion devices that require alignment of a conversion bandwidth with the emission spectrum of the laser.

Preferably, although not critical, the low level gain current $I_{LOW}$ that is reached during modulation is below the threshold current $I_{TH}$ and may be set as low as zero because it is contemplated that this will enhance carrier density excursion during oscillation. To help eliminate the aforementioned impact of mode hopping and wavelength drift, the frequency of the cavity mode oscillations should be larger than the rate at which the semiconductor laser would otherwise exhibit mode hops. As a result, the fast wavelength chirping produced by the cavity mode oscillations overwhelms the mode hops created by the thermal patterning effect.

Figure 7:
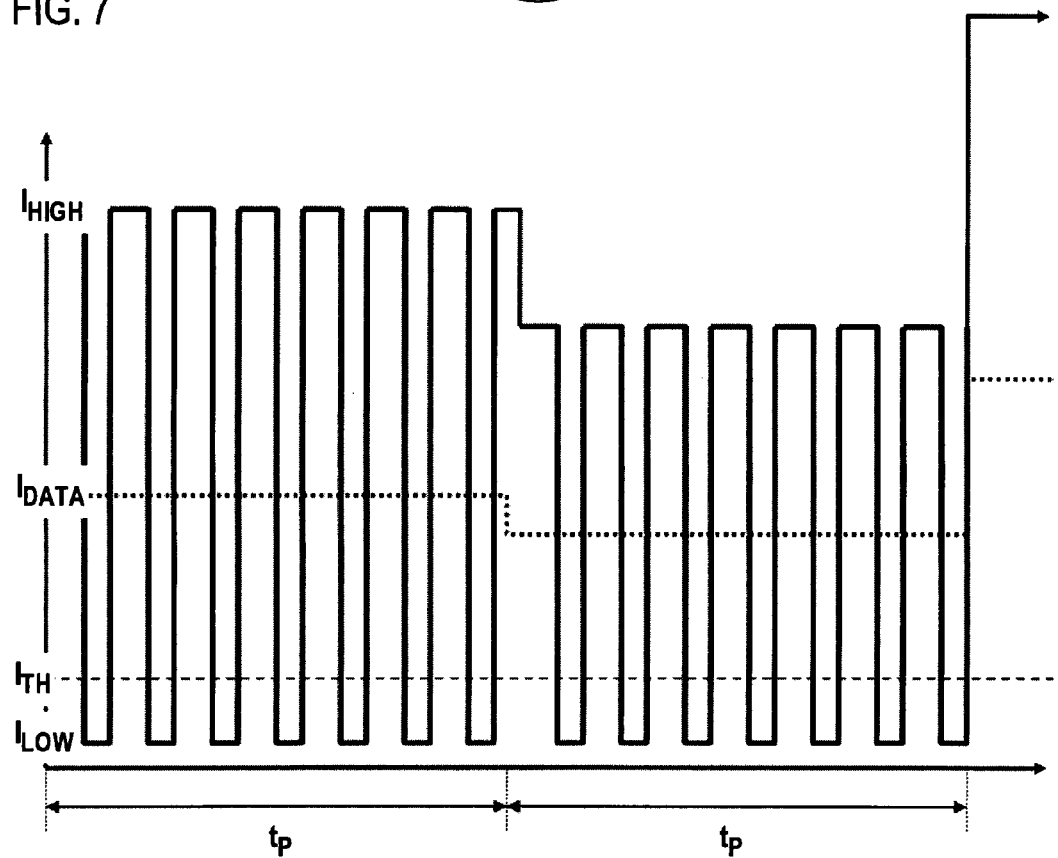
FIG. 7 is a chart illustrating gain current modulation according to one embodiment of the present invention.

The high level gain current $I_{HIGH}$, low level gain current $I_{LOW}$, and threshold current $I_{TH}$, are illustrated schematically in the plot of FIG. 7 in the context of a pixel-based laser projection system. Each pixel is typically characterized by a pixel duration $t_P$, which may vary from pixel to pixel, and a color-specific luminance value, which can be proportional to the high level gain current $I_{HIGH}$ or a target gain current value $I_{DATA}$. In cases where the target gain current value $I_{DATA}$ is used as a reference for pixel luminance, the respective values for the high level gain current $I_{HIGH}$ and the low level gain current $I_{LOW}$ are controlled such that a combination of the two currents is proportional to the target gain current value $I_{DATA}$. For a special case where the low-level gain drive current is below threshold current, only the amplitude and duty cycle of the high-level gain drive current $I_{HIGH}$ should be controlled to achieve the target gain drive current value $I_{DATA}$. The pixel luminance will typically vary across the projected pixels, as is represented in the varying magnitudes of the target gain current value $I_{DATA}$. Typically, the high level gain current $I_{HIGH}$ is higher than the lasing threshold $I_{TH}$ of the semiconductor laser and may be on the order of about 100 times the lasing threshold $I_{TH}$ of the semiconductor laser. The waveform of the gain current can be made of pulse waves as is illustrated in FIG. 7 or other waveforms such as square waves or Sine waves.

As is noted above the modulation frequency may be on the order of about 0.5 GHz but it is contemplated that suitable results may also be achieved at lower modulation frequencies, e.g., perhaps as low as about 0.1 GHz. Alternatively, it may be helpful to refer to the respective durations of the data periods encoded in the laser drive current $I_{GAIN}$ and control the modulation such that the modulation period is significantly shorter than the duration of the data period. For example, in the case of a laser projection system where pixels are illuminated for a period on the order of about 40 nsec, the drive current $I_{GAIN}$ can be modulated at a period of less than about 10 nsec. As a further example, it is contemplated that the frequency of the drive current modulation can be controlled such that the drive current $I_{GAIN}$ cycles through at least about 4 periods for each display pixel.

Figure 6:
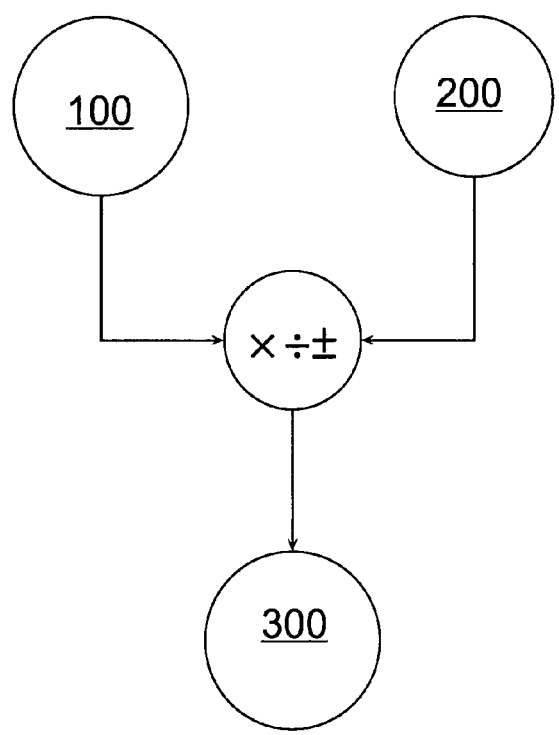
FIG. 6 illustrates a scheme for controlling the gain current of a wavelength-chirped semiconductor laser according to some embodiments of the present invention.

FIG. 6 illustrates the manner in which a data signal portion 100 that is used to drive a semiconductor laser can be combined with a modulated wavelength-chirped signal portion 200 according to the present invention. Specifically, as is illustrated in FIG. 6, it is contemplated that these respective signal portions of the gain injection current can be integrated into the drive current 300 ($I_{GAIN}$) by taking a sum or product of the laser data signal 100 and a suitably configured modulated signal portion 200.

In the context of a laser projection system including, for example, a frequency doubled PPLN green light source, without wavelength control according to embodiments of the present invention, the green power emitted by the light source over a single line of the image display will exhibit sudden variations in power due to multiple cavity mode hops. As a result, projected images will have abrupt drops in power with amplitude on the order of 50% and more. However, employing laser control schemes according to particular embodiments of the present invention where the drive signal is modulated to generate the aforementioned wavelength chirping, it is contemplated that wavelength mode hopping will be completely eliminated, or at least substantially mitigated. It is also contemplated that laser control schemes of the present invention may improve the semiconductor laser's resistance to external reflection and reduce speckle problems in laser projection systems since the coherent length of a semiconductor laser is usually reduced by wavelength chirping.

Referring to the laser projection system illustrated schematically in FIG. 2, it is noted that the drive current control schemes according to particular embodiments of the present invention may be executed in a variety of forms within the system. For example, and not by way of limitation, the modulated chirp portion of the gain current may be executed by integrating the modulated chirp portion into the video signal during rendering by the projection software and electronics. In this approach, pixels distributed throughout the image would be altered by the modulated chirp portion independent of the required intensity from the source image. Alternatively, the modulated chirp portion of the gain current may be integrated into the laser drive electronics. In this approach, the laser drive signal, which is derived from the image stream, would be modified to incorporate the modulated chirp portion prior to current scaling.

It is noted that reference herein to single mode lasers or lasers configured for single mode optical emission should not be taken to restrict the scope of the present invention to lasers that operate in a single mode exclusively. Rather, the references herein to single mode lasers or lasers configured for single mode optical emission should merely be taken to imply that lasers contemplated according to particular embodiments of the present invention will be characterized by an output spectrum where a single mode of broad or narrow bandwidth is discernable therein or by an output spectrum that is amenable to discrimination of a single mode therefrom through suitable filtering or other means.

Those skilled in the art will recognize that the active pixel duration $t_P$ referred to above and illustrated in FIG. 7 may vary modestly and periodically across the image as a result of scanning speed variations. Accordingly, reference to a projecting system that is characterized by a "pixel duration" or "encoded data period" should not be taken to denote that each pixel in an image has the same pixel duration. Rather, it is contemplated that individual pixels within the display may have different pixel durations that each fall under the general concept of a display characterized by an active pixel duration $t_P$.

A multi-tone image can be generated by the image projection system by configuring the image projection electronics and the corresponding laser drive currents to establish a pixel intensity that varies across the array of image pixels. In this case, the modulated wavelength chirp portion of the drive current is superimposed upon the signal that encodes the varying pixel intensity. Further detail concerning the configuration of scanning laser image projection systems and the manner in which varying pixel intensities are generated across an image is beyond the scope of the present invention and may be gleaned from a variety of readily available teachings on the subject.

Although the present invention has been described with primary reference to pixel-based projection systems, it is contemplated that other projection systems, such as spatial light modulator based systems (including digital light processing (DLP), transmissive LCD, and liquid crystal on silicon (LCOS)), incorporating laser-based light sources may benefit from the wavelength stabilization and dithering techniques described herein. In these other systems the relevant period exogenous to the laser is not the pixel period but the inverse of the screen refresh rate, or a fraction thereof.

Reference is made throughout the present application to various types of currents. For the purposes of describing and defining the present invention, it is noted that such currents refer to electrical currents. Further, for the purposes of defining and describing the present invention, it is noted that reference herein to "control" of an electrical current does not necessarily imply that the current is actively controlled or controlled as a function of any reference value. Rather, it is contemplated that an electrical current could be controlled by merely establishing the magnitude of the current.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

For the purposes of defining and describing the present invention, it is noted that reference herein to values that are "on the order of" a specified magnitude should be taken to encompass any value that does not vary from the specified magnitude by one or more orders of magnitude.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. Further, it is noted that reference to a value, parameter, or variable being a "function of" another value, parameter, or variable should not be taken to mean that the value, parameter, or variable is a function of one and only one value, parameter, or variable.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation. e.g., "substantially above zero," varies from a stated reference, e.g., "zero," and should be interpreted to require that the quantitative representation varies from the stated reference by a readily discernable amount.

What is claimed:

1. A laser controller programmed to operate a visible light source comprising a semiconductor laser and a wavelength conversion device optically coupled to the semiconductor laser, wherein the controller is programmed such that at least the following conditions apply to the operation of the semiconductor laser:
   the laser controller comprises at least one output for a drive current $I_{GAIN}$ to be injected into the gain section of the semiconductor laser;
   the laser controller is programmed to control at least one parameter of the semiconductor laser at least partially in response to the drive current $I_{GAIN}$; and
   the laser is further programmed to alter mode selection in the semiconductor laser by configuring the semiconductor laser for optical emission of encoded data characterized by a plurality of encoded data periods, at least one parameter of the optical emission being a function of a drive current $I_{GAIN}$ injected into a gain section of the semiconductor laser and modulating the drive current $I_{GAIN}$ to broaden the effective spectral width of the semiconductor laser wherein the modulated drive current $I_{GAIN}$ forces a plurality of different emission modes to be selected in the semiconductor laser within respective ones of the encoded data periods but maintains the effective spectral width of the semiconductor laser within the FWHM wavelength conversion bandwidth of the wavelength conversion device.

2. A laser projection system comprising at least one semiconductor laser, a wavelength conversion device optically coupled to the semiconductor laser, and a laser controller programmed to operate the semiconductor laser wherein the controller is programmed such that at least the following conditions apply to the operation of the semiconductor laser:
   the laser controller comprises at least one output for a drive current $I_{GAIN}$ to be injected into the gain section of the semiconductor laser;
   the laser controller is programmed to control at least one parameter of the semiconductor laser at least partially in response to the drive current $I_{GAIN}$; and
   the laser is further programmed to alter mode selection in the semiconductor laser by configuring the semiconductor laser for optical emission of encoded data characterized by a plurality of encoded data periods, at least one parameter of the optical emission being a function of a drive current $I_{GAIN}$ injected into a gain section of the semiconductor laser and modulating the drive current $I_{GAIN}$ to broaden the effective spectral width of the semiconductor laser wherein the modulated drive current $I_{GAIN}$ forces a plurality of different emission modes to be selected in the semiconductor laser within respective ones of the encoded data periods but maintains the effective spectral width of the semiconductor laser within the FWHM wavelength conversion bandwidth of the wavelength conversion device.

3. A method of controlling a visible light source comprising a semiconductor laser and a wavelength conversion device, wherein the semiconductor laser is optically coupled to the wavelength conversion device and the method comprises:
   configuring the semiconductor laser for optical emission of encoded data characterized by a plurality of encoded data periods, at least one parameter of the optical emission being a function of a drive current $I_{GAIN}$ injected into a gain section of the semiconductor laser; and
   modulating the drive current $I_{GAIN}$ to broaden the effective spectral width of the semiconductor laser, wherein the modulated drive current $I_{GAIN}$ forces a plurality of different emission modes to be selected in the semiconductor laser within respective ones of the encoded data periods but maintains the effective spectral width of the semiconductor laser within the FWHM wavelength conversion bandwidth of the wavelength conversion device.

4. A method as claimed in claim 3 wherein the effective spectral width of the semiconductor laser is broadened from less than about 0.02 nm to greater than about 0.06 nm and the FWHM wavelength conversion bandwidth of the of the wavelength conversion device is between about 0.16 nm and about 0.2 nm.

5. A method as claimed in claim 3 wherein:
   the drive current $I_{GAIN}$ is modulated between a low level gain current $I_{LOW}$ and a high level gain current $I_{HIGH}$; and
   the low level gain current $I_{LOW}$ is below the lasing threshold $I_{TH}$ of the semiconductor laser.

6. A method as claimed in claim 5 wherein the high level gain current $I_{HIGH}$ is higher than the lasing threshold $I_{TH}$ of the semiconductor laser.

7. A method as claimed in claim 5 wherein the high level gain current $I_{HIGH}$ is on the order of about 100 times the lasing threshold $I_{TH}$ of the semiconductor laser.

8. A method as claimed in claim 3 wherein:
the drive current $I_{GAIN}$ is modulated between a low level gain current $I_{LOW}$ and a high level gain current $I_{HIGH}$; and
the low level gain current $I_{LOW}$ is set to about zero.

9. A method as claimed in claim 3 wherein:
the drive current $I_{GAIN}$ is modulated between a low level gain current $I_{LOW}$ and a high level gain current $I_{HIGH}$; and
the high level gain current $I_{HIGH}$ represents the encoded data and varies across the encoded data periods.

10. A method as claimed in claim 3 wherein:
the drive current $I_{GAIN}$ is modulated between a low level gain current $I_{LOW}$ and a high level gain current $I_{HIGH}$; and
the high level gain current $I_{HIGH}$ and the low level gain current $I_{LOW}$ are combined to represent the encoded data and vary across the encoded data periods.

11. A method as claimed in claim 3 wherein the drive current $I_{GAIN}$ is modulated to an extent sufficient to generate carrier density oscillation within respective ones of the encoded data periods.

12. A method as claimed in claim 3 wherein the drive current $I_{GAIN}$ is modulated to an extent sufficient to generate wavelength oscillations among at least two cavity modes of the semiconductor laser.

13. A method as claimed in claim 12 wherein the frequency of the cavity mode oscillations is larger than a rate at which the semiconductor laser would otherwise exhibit mode hops due to a wavelength thermal patterning effect.

14. A method as claimed in claim 3 wherein the effective spectral width of the semiconductor laser is broadened about three-fold.

15. A method as claimed in claim 3 wherein the drive current $I_{GAIN}$ is modulated at a frequency of at least about 0.1 GHz.

16. A method as claimed in claim 3 wherein the drive current $I_{GAIN}$ is modulated at a frequency on the order of about 0.5 GHz.

17. A method as claimed in claim 3 wherein the respective durations of the encoded data periods is on the order of about 40 nsec and the drive current $I_{GAIN}$ is modulated at a period of at least about 10 nsec.

18. A method as claimed in claim 3 wherein the frequency of the drive current modulation is such that the drive current $I_{GAIN}$ cycles through at least about 4 periods within corresponding ones of the encoded data periods.

19. A method as claimed in claim 3 wherein the semiconductor laser is coupled to a wavelength conversion device as part of a visible light source and is comprised within a laser projection system, the method comprising:
generating a scanned laser image by scanning an output beam of the visible light source across the image, wherein the scanned laser image comprises an array of image pixels, the image pixels being characterized by respective active pixel durations $t_p$; and
modulating the drive current $I_{GAIN}$ such that a plurality of different emission modes are selected over respective ones of the active pixel durations $t_p$.

20. A method as claimed in claim 3 wherein the semiconductor laser is part of a visible light source and is comprised within a laser projection system and the method comprises:
generating a laser image utilizing an output beam of the visible light source, wherein the amplitude of the drive current $I_{GAIN}$ is modulated at a data signal frequency with an image signal to control intensity of the output beam for the encoded data periods; and
modulating the drive current $I_{GAIN}$ at a frequency higher than the data signal frequency such that a plurality of different emission modes are selected over respective ones of the encoded data periods $t_p$.

* * * * *